United States Patent
Nowshadi

(10) Patent No.: US 7,117,321 B2
(45) Date of Patent: Oct. 3, 2006

(54) SYSTEM AND METHOD FOR INTERLEAVING SDRAM DEVICE ACCESS REQUESTS

(75) Inventor: Farshid Nowshadi, Beds (GB)

(73) Assignee: Conexant, Inc., Red Bank, NJ (US)

( * ) Notice: Subject to any disclaimer, the term of this patent is extended or adjusted under 35 U.S.C. 154(b) by 622 days.

(21) Appl. No.: 10/614,219

(22) Filed: Jul. 8, 2003

(65) Prior Publication Data

US 2006/0168408 A1    Jul. 27, 2006

Related U.S. Application Data

(60) Provisional application No. 60/393,729, filed on Jul. 8, 2002.

(51) Int. Cl.
*G06F 12/00* (2006.01)

(52) U.S. Cl. .................. 711/157; 711/105; 711/167; 365/230.04; 365/233

(58) Field of Classification Search ................ 711/100, 711/105, 151, 154, 157–158, 167–173; 365/203, 365/233, 230.02, 230.04, 189.02
See application file for complete search history.

(56) References Cited

U.S. PATENT DOCUMENTS

| | | | |
|---|---|---|---|
| 4,785,428 A | 11/1988 | Bajwa et al. | |
| 5,893,136 A | 4/1999 | Stolt et al. | |
| 5,987,574 A | 11/1999 | Paluch | |
| 6,131,146 A | 10/2000 | Aono | |
| 6,622,228 B1 | 9/2003 | Jeddeloh | |
| 6,661,721 B1 | 12/2003 | Lehmann et al. | |

OTHER PUBLICATIONS

International Search Report dated Mar. 4, 2004 for Application No. PCT/US03/21357.

*Primary Examiner*—Nasser Moazzami
(74) *Attorney, Agent, or Firm*—Hunton & Williams LLP

(57) ABSTRACT

A method and system is provided for interleaving multiple cycles streams from clients seeking SDRAM access. More particularly, a master scoreboard register is established for enabling the interleaving of many clients SDRAM access requests into a single stream optimized for maximum packing density of the different streams, thereby reducing the overhead associated with each individual stream. In one embodiment, at least one Master Score Board Register (MSBR) is provided for storing the order of cycles to go out of a controller/processor and to the SDRAM. If there is a set bit in a particular location in the MSBR then it means that the cycle is occupied and already allocated and cannot be used for anything else. If the bit is not set then the cycle that bit represents a vacant slot is ready for use by a client. Upon receipt of an SDRAM request, an interleaving engine identifies the bit locations in the MSBR associated with the requested cycles. It is then determined whether any of the requested bits are spoken for in the MSBR. If so, the client's command sequence is rejected for at least the present clock cycle and the MSBR is incremented and the requested bits are checked again during the next clock cycle.

18 Claims, 5 Drawing Sheets

Sequence with Interleave Mode Off

FIG. 5a

Sequence with Interleave Mode On

FIG. 5b

Sequence with Interleave Mode Off

FIG. 6a

Sequence with Interleave Mode On

FIG. 6b

SYSTEM AND METHOD FOR INTERLEAVING SDRAM DEVICE ACCESS REQUESTS

CROSS REFERENCE TO RELATED APPLICATIONS

Priority is claimed based on U.S. Provisional Application No. 60/393,729 entitled "System And Method For Interleaving SDRAM Device Access Requests" filed Jul. 8, 2002.

BACKGROUND OF THE INVENTION

The present invention relates generally to the field of computer systems and, more particularly, to systems and methods for accessing SDRAM devices in such computer systems.

Accessing SDRAM devices require a very specific sequence of commands to be performed on the bus. The order of the commands presented on the bus is not fixed and varies according to the mode the SDRAM devices are configured to, the bus frequency and the type of access requested. There are also many rules about the spacing between commands with many commands having a minimum spacing between other commands and other commands having no minimum spacing. The issue is further complicated by the fact the command sequences from two different access can overlap each other. This is a feature of the SDRAM that sequences of commands need not necessarily be executed serially one after another but can overlap. This overlapping feature of SDRAM devices can greatly improve the efficiency of the accesses effectively eliminating much of the overhead associated with SDRAM memory access and improves bandwidth efficiency by exploiting the use of opening multiple banks within the SDRAM device.

Accordingly, there is a need in the art of computer systems for an improved method and system for providing access to SDRAM devices.

SUMMARY OF THE INVENTION

The present invention overcomes the problems noted above, and realizes additional advantages, by providing for methods and systems for interleaving multiple cycles streams from clients seeking SDRAM access. The novel feature of this invention is the ability to interleave the requirements of many clients wishing to access a SDRAM device into a single stream that optimized for maximum packing density of the different streams, thereby reducing the overhead associated with each individual stream.

Initially, in one embodiment of the present invention, at least one Master Score Board Register (MSBR) is provided in system memory. The MSBR stores the order of cycles to go out of processor and to the SDRAM. If there is a set bit in a particular location in the MSBR then it means that the cycle is occupied and already allocated and cannot be used for anything else. If the bit is not set then the cycle that bit represents a vacant slot is ready for use by a client. Upon receipt of an SDRAM request, an interleaving engine identifies the bit locations in the MSBR associated with the requested cycles. It is then determined whether any of the requested bits are spoken for in the MSBR. If so, the client's command sequence is rejected for at least the present clock cycle and the MSBR is incremented by one, wherein the MSBR is shifted by 1 to the left and a zero is inserted into the right of the register. The bit (from the left) that is shifted out of the MSBR tells the SDRAM controller whether it should drive a command out on the next clock tick.

Once the MSBR has been incremented, client again inspects the MSBR bits for the requested bits on the next clock cycle. In this manner, as every clock tick the MSBR gets shifted left then the pattern the client compares itself to is continually changing. Eventually, if the client waits long enough the bits required by the client will become available. Once it is determined that the requested bits are available, the interleave engine accepts the sequence and updates the MSBR to reflect the accepted bits. Next, the client is informed that the sequence has been accepted and is pending to go out.

BRIEF DESCRIPTION OF THE DRAWINGS

The present invention can be understood more completely by reading the following Detailed Description of the Preferred Embodiments, in conjunction with the accompanying drawings.

FIGS. 5a and 5b is a SDRAM request sequence of a back-to-back random read cycle to the same bank.

FIGS. 6a and 6b is a SDRAM request sequence of a back-to-back random read cycle to different banks.

DETAILED DESCRIPTION OF THE INVENTION

In a system where there are many clients that require access to the SDRAM devices and each of these clients requests their own unique command sequence, it has been determined that one key to providing fast and accurate SDRAM access is to determine how to combine each of the received command sequences into one stream ready for delivery to the SDRAM. In accordance with the present invention, pattern interleaving is employed in the following manner to obtain the desired results.

In a preferred embodiment, an SDRAM request stream is generated in such a way as to address each of the following concerns: speed, robustness, and efficiency. In light of these needs, the system of the present invention provides a quick technique for combining stream. That is, interleaving decisions are preferably be made by a software or hardware interleaving engine or general SDRAM controller within a single clock tick. Regarding robustness, the system of the present invention is capable of handling a large number of clients without unduly impeding performance. Additionally, the present system ensures that no rules are broken either within each of the individual clients stream or within the combined stream. Furthermore, the present system also preferably optimizes the packing density of the streams. That is, the streams should be combined in such a way to maximize the bus utilization and try to make sure every clock tick counts and is carrying useful data.

Figure 1:
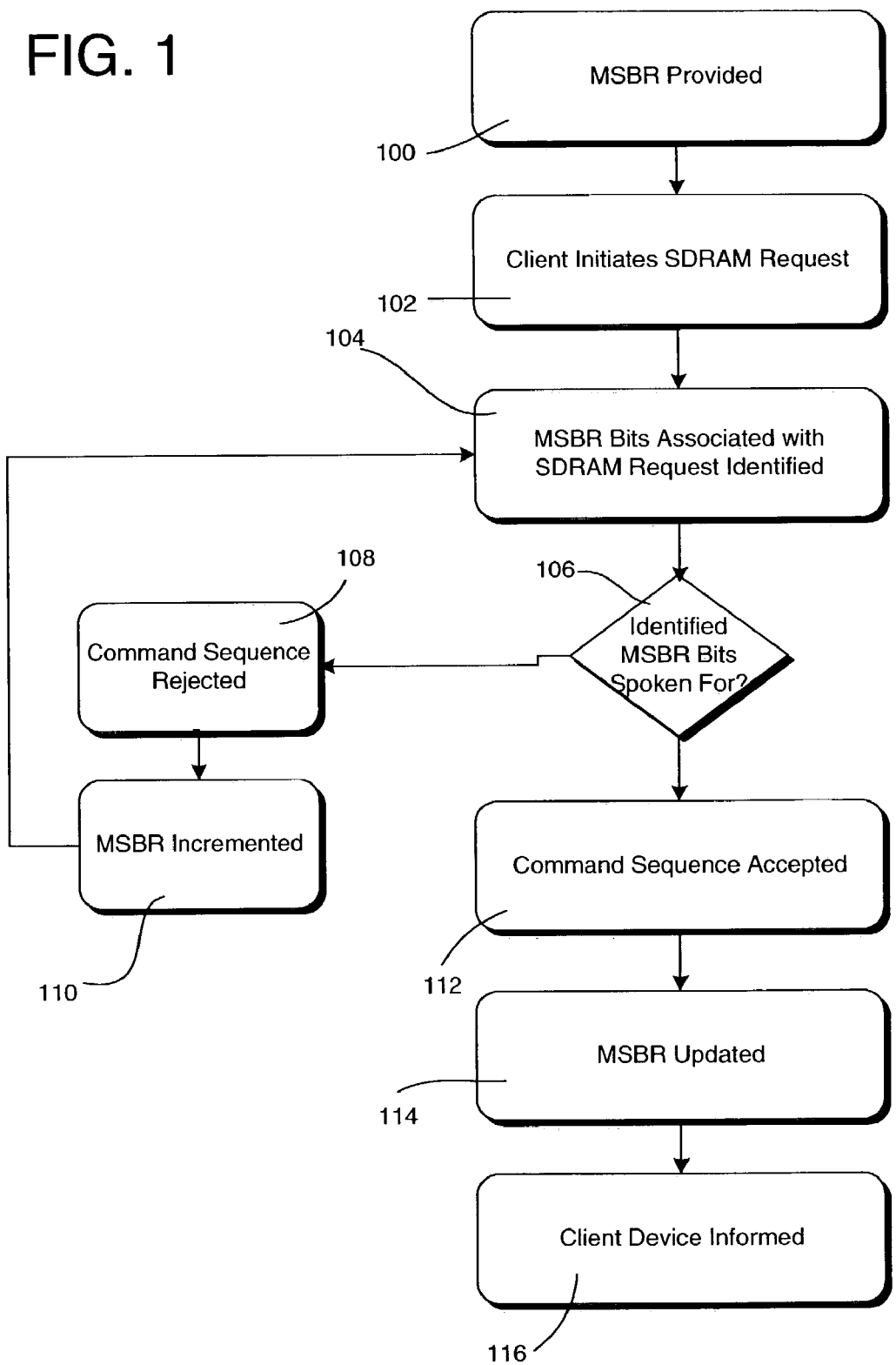
FIG. 1 is a flow diagram illustrating one embodiment of a method for interleaving SDRAM requests.

Referring now to FIG. 1, there is shown a flow diagram illustrating one embodiment of a method for interleaving SDRAM requests in accordance with the present invention. Generally speaking, the solution employed by the present invention effectively utilizes an interleaving engine to preassemble the order of up to 25 cycles before the cycles leave the processor and are presented to the SDRAMs. Initially, to achieve this, at least one Master Score Board Register (MSBR) is provided in step 100. The MSBR stores the order of cycles to go out of processor and to the SDRAM. In one embodiment, the MSBR is a 25 bit register, wherein each bit in the register represents 1 cycle and the order of the bits is the order of the cycles that go out on the bus. If there is a set bit in a particular location then it means that the cycle is occupied and already allocated and cannot be used for anything else. It the bit is not set then the cycle that bit represents a vacant slot ready for use by a client.

In step 102, a client initializes an SDRAM request. Next, in step 104, the interleaving engine identifies the bit locations in the MSBR associated with the requested bits. In step 106, it is determined whether any of the requested bits are spoken for in the MSBR. If so, the client's command sequence is rejected for at least the present clock cycle in step 108 and the process continues to step 110 where the MSBR is incremented by one. In one embodiment, the MSBR incrementation of step 110, comprises shifting the MSBR by 1 to the left and inserting a zero into the right. The bit (from the left) that is shifted out of the MSBR tells the SDRAM controller whether it should drive a command out on the next clock tick.

Once the MSBR has been incremented, the process returns to step 104 where an inspection of the MSBR bits is again performed for the requested bits on the next clock cycle. In this manner, as every clock tick the MSBR gets shifted left then the pattern the client compares itself to is continually changing.

Figure 2:
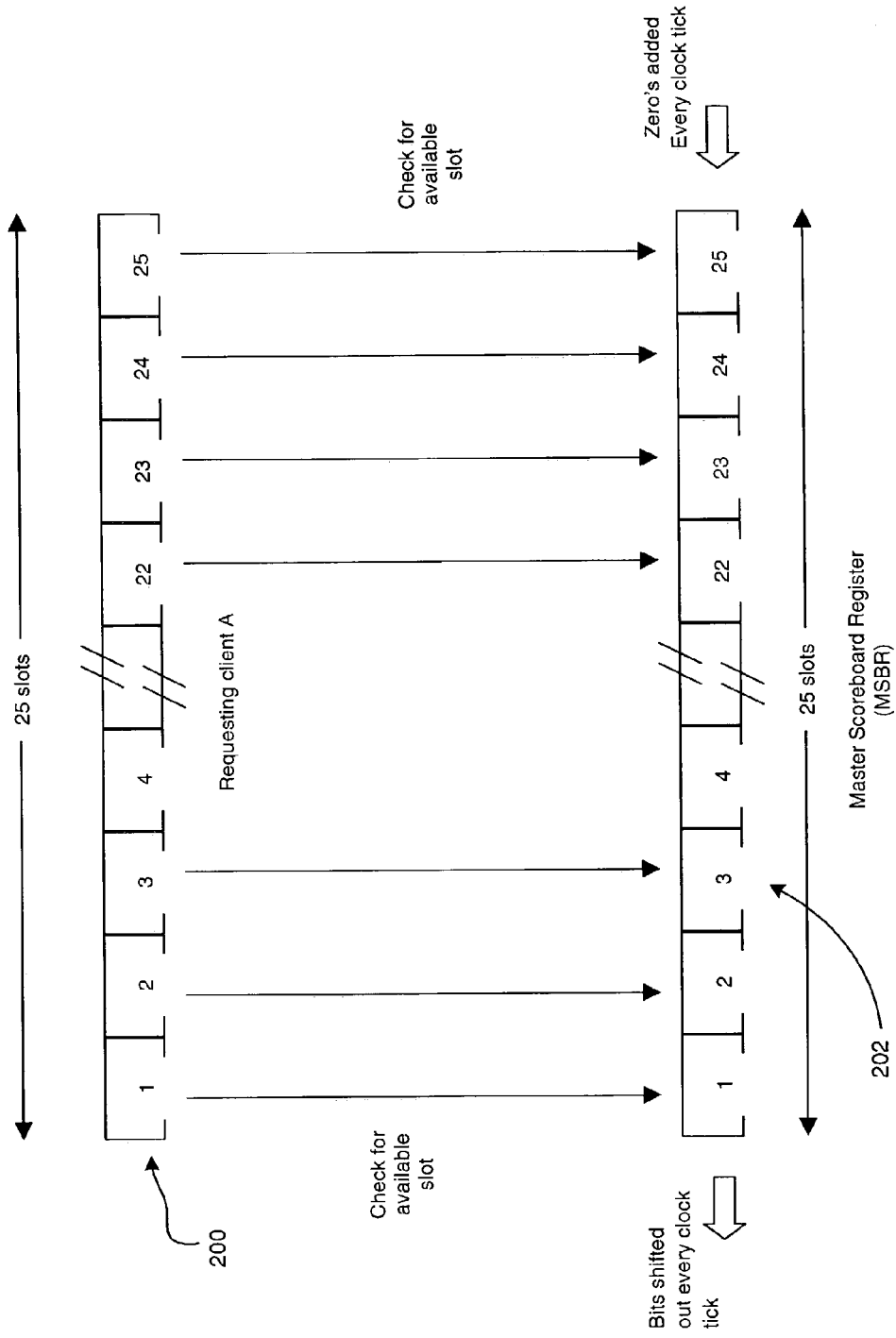
FIG. 2 is a graphical depiction of the relationship described in FIG. 1.

Eventually, if the client waits long enough the bits required by the client will become available. Once it is determined that the requested bits are available in step 106, the interleave engine accepts the sequence in step 112. In step 114, the interleave engine updates the MSBR to reflect the accepted bits and, in step 116, informs the client that the sequence has been accepted and is pending to go out. FIG. 2, graphically illustrates one embodiment of the above-described relationship between the requesting client device 200 and the MSBR 202, wherein the MSBR and the client SDRAM request each include 25 bits.

Figure 3:
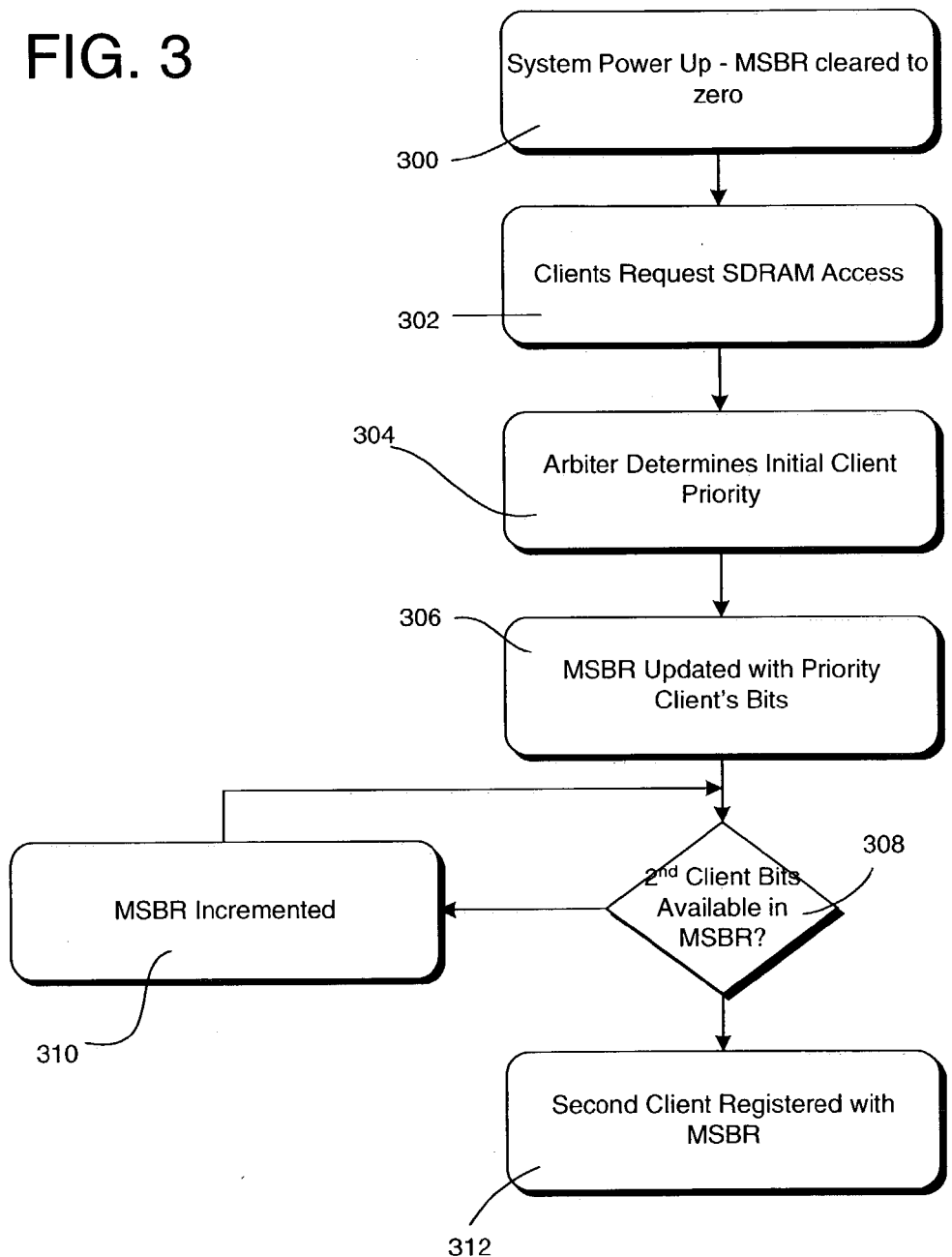
FIG. 3 is a flow diagram illustrating a second embodiment of a method for interleaving SDRAM requests.

Referring now to FIG. 3, there is shown a flow diagram illustrating a second embodiment of a method for interleaving SDRAM requests in accordance with the present invention. On power up, in step 300, the MSBR powers up with all 25 bits cleared to zero, meaning that all cycles are available. In step 302, two clients (Client A and Client B) wish to access the SDRAM bus, with each client wishes to perform a unique command sequence on clock tick 1. For the purposes of the present example, it should be assumed that client A has a sequence that needs to use cycles 1, 2 and 5, while client B has a sequence that uses cycles 1, 5 and 7.

In step 304, an arbiter determines which of the client requests has priority preferably by using a priority scheme the details of which are outside the scope of the present invention. For the sake of the present example, let's assume that the arbiter picks Client A. Once a client has been picked (which in this case is A) the MSBR is updated in step 306 with the bits requested by that client. So, in this example, bits 1,2 and 5 are set in the MSBR. Next, in step 308, it is determined whether the bits requested by Client B are simultaneously available in the MSBR. In the present example, since both Client A and B are requesting bits 1 and 5, the corresponding bits in the MSBR are not available to Client B on the first clock cycle.

In step 310, the MSBR is shifted by 1 to the left in the manner described above. Accordingly, on clock tick 2 after the shift, the MSBR now has bits 1 (formally bit 2) and bit 4 (formally bit 5) set. The process then returns to step 308 for the next clock tick where client B again determines whether its requested bits are available in the MSBR, so that it may proceed with its command sequence. Because bit 1 is still set for Client A, the Client B requested bits are not all available. The MSBR is again shifted in step 310 and, on clock 3, the MSBR now has only bit 3 (formerly bit 4) set for Client A. The process again returns to step 308 where Client B determines whether its requested bits are available in the MSBR. Because the requested bits are now available, Client B is able to register itself with the MSBR in step 312. In one embodiment, this registration is performed by OR'ing Client B's requested bit locations (namely 1, 5 and 7) with the MSBR.

Figure 4:
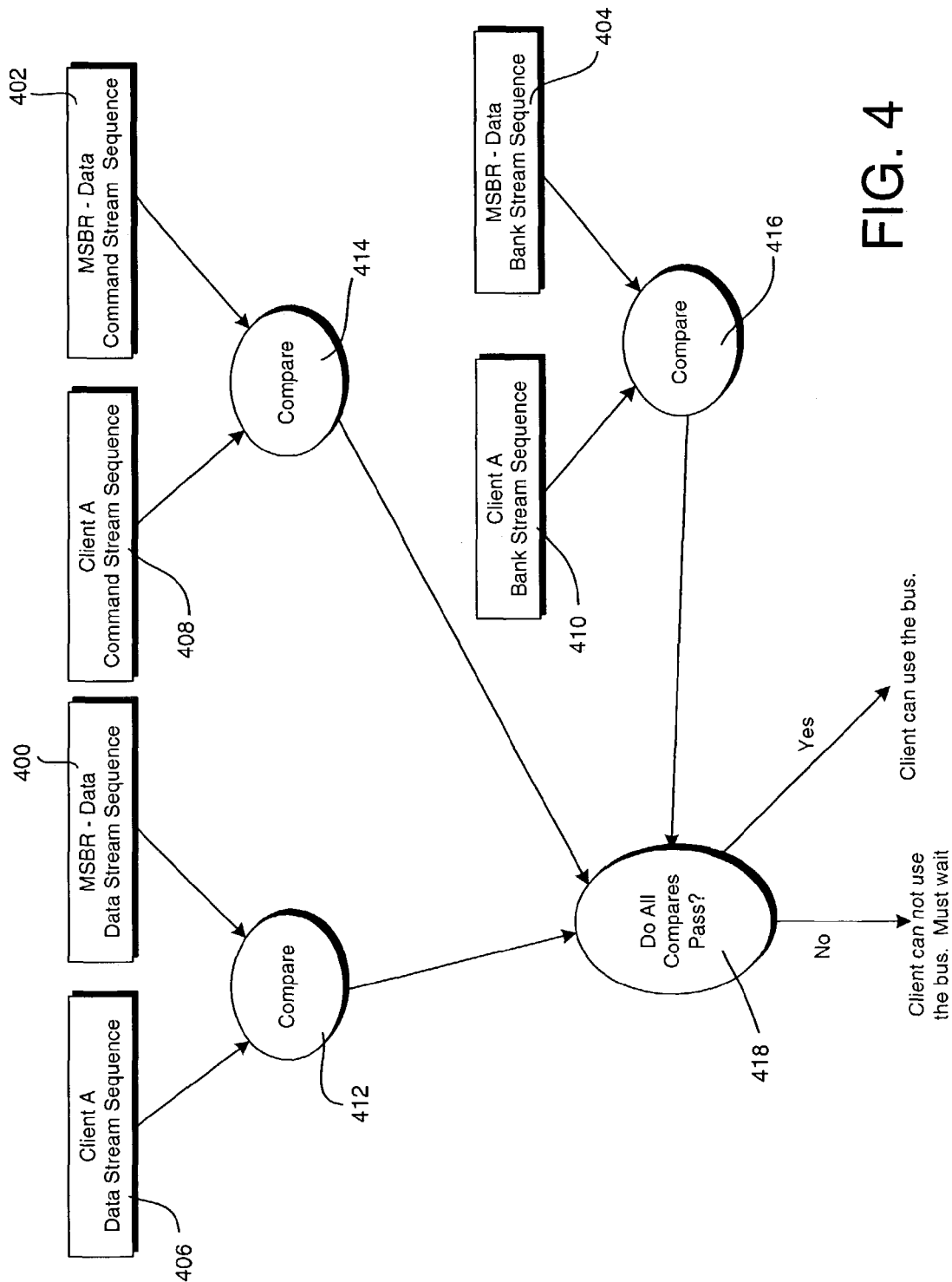
FIG. 4 is a flow diagram illustrating a third embodiment of a method for interleaving SDRAM requests.

Referring now to FIG. 4, there is shown a flow diagram illustrating a third embodiment of the present invention. For the embodiment of FIG. 4, there is provided three distinct MSBR's, a first MSBR 400 for checking availability of space on the data bus linking the processor to the physical SDRAM device, a second MSBR 402 for checking availability on the command bus, and the last MSBR 404 for checking against a clash between banks. In this embodiment, banks are partitions within the SDRAM devices which prohibit the interleaving of certain addresses with other addresses.

In this embodiment, each client when making a request for the SDRAM bus must in fact present three streams (406, 408 and 410) to compare against the three MSBR's (400, 402, and 404), one for the data bus 406, one for command bus 408 and one for the banks 410. These comparisons are illustrated by processes 412, 414 ands 416, respectfully in FIG. 4. Only when there is no clash on all three streams (as determined in process 418) can the client have an opportunity to have access the SDRAM bus (providing, of course, that the arbiter decides to give the bus to that client and not another client that also doesn't have the clash).

The outcome of this embodiment, is that the MSBR in the SDRAM interleave engine can merge and resolve the requirements of many clients in such a way that it checks for clashes and resolves conflicts of resource sharing in an efficient and optimized way.

The interleave methods described above lend themselves to hardware implementation very easily. Compares of the clients stream and the MSBR are done with an AND gate. Additionally, updating the MSBR may be accomplished by a simple OR function. Both these functions (i.e., the OR and AND functions) may be done in parallel, which means the operation is quick and can easily be done within a single clock period.

EXAMPLE 1

Referring now to FIG. 5a, there is shown a typical SDRAM request sequence of a back-to-back random read cycle to the same bank. This combination is probably the most common one seen on a typical bus. Without incorporating the interleave mode the present invention, the second access must wait until the first is finished before it starts. Once interleave mode is switched on, as illustrated in FIG. 5b, however, a write sequence (referenced below in bold characters) can happen invisibly in the middle of the two read sequences. The write cycle has no impact on the read cycles whatsoever. This hidden write is only possible if it is written to a different bank.

EXAMPLE 2

Referring now to FIG. 6a, there is shown a SDRAM request sequence of a back-to-back random read cycle to the different banks. The text in each shading style represents a access to a different bank. With interleave off as in FIG. 6a, the performance is very lacklustre, the efficiency of the bandwidth (i.e. the ratio of useful data being transferred to overhead) is only 38%. Once interleave mode is switched on however, as in FIG. 6b, the bank accesses can be overlapped almost doubling the efficiency. From the above, it can be seen that 4 random reads have occurred in the same time as 2 with interleave switched off. Interestingly enough, it can also bee seen that the latency experienced by the cycles referenced in the horizontal shading has also been reduced by 7 clock ticks.

In each of the embodiments described above, each client only presents one data stream to the MSBR for comparison, however in an alternative embodiment of the present invention, each client could potentially morph the command sequences into more than one variation, thereby increasing its probability of not getting a clash of recourses in the MSBR. In such an embodiment, each client would have to make sure the various streams presented for evaluation are valid and don't break any rules. For example, if a client needs access to cycles 1,5 and 10 there may other possibilities that could also be valid for example 1,6,10 or 1,5,11 in this case the client will preset all 3 streams up for evaluation. The probability is thus greatly increased for a client to get in on at least one stream. When a stream is accepted, the interleave engine would then inform the requesting client which of the proposed streams was accepted.

While the foregoing description includes many details and specificities, it is to be understood that these have been included for the purposes of explanation only, and are not to be interpreted as limitations of the present invention. Many modifications to the embodiments described above can be made without departing from the spirit and scope of the invention, as is intended.

What is claimed is:

1. A method for interleaving SDRAM device access requests, comprising the steps of:
   establishing at least one master scoreboard register having a number of bits corresponding to a number of available request cycles and wherein a value of each bit in the at least one master scoreboard register is indicative of whether an access command has been accepted for delivery to the SDRAM;
   receiving an SDRAM access request from at least one device, wherein the SDRAM access requests includes at least one requested cycle for accessing the SDRAM;
   identifying the bits in the at least one master scoreboard register associated with the at least one requested cycle;
   determining whether at least one of the identified bits have been previously set;
   accepting the SDRAM access request if it is determined that none of the identified bits have been previously set; and
   performing the following steps if it is determined that at least one of the identified bits has been previously set:
      incrementing the at least one master scoreboard register by one bit; and
      returning, at a subsequent clock tick, to the step of identifying the bits in the at least one scoreboard register associated with the at least one requested cycle.

2. The method of claim 1, wherein the at least one master scoreboard register is a 25 bit register.

3. The method of claim 1, wherein the step of incrementing the at least one master scoreboard register, further comprises the steps of:
   removing the leftmost bit in the at least one master scoreboard register;
   shifting all remaining bits in the at least one master scoreboard register to the left; and
   inserting a zero bit as the rightmost bit in the at least one master scoreboard register,
   wherein the removed leftmost bit is indicative of any SDRAM access command going out on a next clock cycle.

4. The method of claim 1, further comprising the step of clearing all bits in the at least one master scoreboard register upon system power up.

5. The method of claim 1, further comprising the steps of:
   receiving multiple simultaneous SDRAM access requests from at least two devices; and
   determining a device priority to establish an order of SDRAM access requests.

6. The method of claim 1, wherein the step of accepting the SDRAM access request, further comprises the step of registering the accepted SDRAM access cycles with the at least one master scoreboard register, thereby setting the bits in the at least one master scoreboard register which correspond to the accepted SDRAM access cycles.

7. The method of claim 6, wherein the step of registering the accepted SDRAM access cycles comprises logically OR'ing the bit locations corresponding to the accepted SDRAM access cycles into the at least one master scoreboard register.

8. The method of claim 1, wherein the at least one master scoreboard register includes a data bus master scoreboard register, a command bus master scoreboard register, and a banks master scoreboard register.

9. The method of claim 8, further comprising:
   identifying the bits in each of the data bus master scoreboard register, the command bus master scoreboard register, and the banks master scoreboard register associated with the at least one requested cycle;
   determining whether at least one of the identified bits have been previously set in each of the data bus master scoreboard register, the command bus master scoreboard register, and the banks master scoreboard register;
   accepting the SDRAM access request if it is determined that none of the identified bits have been previously set; and
   performing the following steps if it is determined that at least one of the identified bits has been previously set:
      incrementing each of the data bus master scoreboard register, the command bus master scoreboard register, and the banks master scoreboard register by one bit; and
      returning, at a subsequent clock tick, to the step of identifying the bits in each of the data bus master scoreboard register, the command bus master scoreboard register, and the banks master scoreboard register associated with the at least one requested cycle.

10. A computer-readable medium incorporating one or more instructions for interleaving SDRAM device access requests, the instructions comprising:
   one or more instructions for establishing at least one master scoreboard register having a number of bits corresponding to a number of available request cycles and wherein a value of each bit in the at least one master scoreboard register is indicative of whether an access command has been accepted for delivery to the SDRAM;

one or more instructions for receiving an SDRAM access request from at least one device, wherein the SDRAM access requests includes at least one requested cycle for accessing the SDRAM;

one or more instructions for identifying the bits in the at least one master scoreboard register associated with the at least one requested cycle;

one or more instructions for determining whether at least one of the identified bits have been previously set;

one or more instructions for accepting the SDRAM access request if it is determined that none of the identified bits have been previously set; and one or more instructions for performing the following steps if it is determined that at least one of the identified bits has been previously set:

incrementing the at least one master scoreboard register by one bit; and returning, at a subsequent clock tick, to the step of identifying the bits in the at least one scoreboard register associated with the at least one requested cycle.

11. The computer-readable medium of claim 10, wherein the at least one master scoreboard register is a 25 bit register.

12. The computer-readable medium of claim 10, wherein the one or more instructions for incrementing the at least one master scoreboard register, further comprise:

one or more instructions for removing the leftmost bit in the at least one master scoreboard register;

one or more instructions for shifting all remaining bits in the at least one master scoreboard register to the left; and one or more instructions for inserting a zero bit as the rightmost bit in the at least one master scoreboard register, wherein the removed leftmost bit is indicative of any SDRAM access command going out on a next clock cycle.

13. The computer-readable medium of claim 10, further comprising one or more instructions for clearing all bits in the at least one master scoreboard register upon system power up.

14. The computer-readable medium of claim 10, further comprising:

one or more instructions for receiving multiple simultaneous SDRAM access requests from at least two devices; and one or more instructions for determining a device priority to establish an order of SDRAM access requests.

15. The computer-readable medium of claim 10, wherein the one or more instructions for accepting the SDRAM access request, further comprise one or more instructions for registering the accepted SDRAM access cycles with the at least one master scoreboard register, thereby setting the bits in the at least one master scoreboard register which correspond to the accepted SDRAM access cycles.

16. The computer-readable medium of claim 15, wherein the one or more instructions for registering the accepted SDRAM access cycles comprise one or more instructions for logically OR'ing the bit locations corresponding to the accepted SDRAM access cycles into the at least one master scoreboard register.

17. The computer-readable medium of claim 10, wherein the at least one master scoreboard register includes a data bus master scoreboard register, a command bus master scoreboard register, and a banks master scoreboard register.

18. The computer-readable medium of claim 17, further comprising:

one or more instructions for identifying the bits in each of the data bus master scoreboard register, the command bus master scoreboard register, and the banks master scoreboard register associated with the at least one requested cycle;

one or more instructions for determining whether at least one of the identified bits have been previously set in each of the data bus master scoreboard register, the command bus master scoreboard register, and the banks master scoreboard register;

one or more instructions for accepting the SDRAM access request if it is determined that none of the identified bits have been previously set; and one or more instructions for performing the following steps if it is determined that at least one of the identified bits has been previously set:

incrementing each of the data bus master scoreboard register, the command bus master scoreboard register, and the banks master scoreboard register by one bit; and returning, at a subsequent clock tick, to the step of identifying the bits in each of the data bus master scoreboard register, the command bus master scoreboard register, and the banks master scoreboard register associated with the at least one requested cycle.

* * * * *